United States Patent [19]
Lin

[11] Patent Number: 5,542,468
[45] Date of Patent: Aug. 6, 1996

[54] CPU HEAT DISSIPATOR HOOK-UP APPARATUS

[76] Inventor: Chuen-Sheng Lin, No. 31, Sec. 1, Min Yi Road, Wu Ku Hsiang, Taipei Hsien, Taiwan

[21] Appl. No.: 495,393

[22] Filed: Jun. 28, 1995

[51] Int. Cl.⁶ .............................. F28F 7/00; H05K 7/20
[52] U.S. Cl. .................. 165/80.3; 165/185; 174/16.3; 257/719; 361/704; 361/710
[58] Field of Search ....................... 165/80.3, 185; 174/16.3; 257/718, 719; 361/690, 702, 704, 707, 710

[56] References Cited

U.S. PATENT DOCUMENTS

| | | | |
|---|---|---|---|
| 5,396,402 | 3/1995 | Perugini et al. | 361/704 |
| 5,436,798 | 7/1995 | Wieland, Jr. | 361/710 |
| 5,448,449 | 9/1995 | Bright et al. | 361/704 |
| 5,475,564 | 12/1995 | Chiou | 361/704 |

Primary Examiner—Leonard R. Leo
Attorney, Agent, or Firm—Browdy and Neimark

[57] ABSTRACT

A dissipator hook-up apparatus has a metal pressing board and a metal hook-up board. The two sides of the metal pressing board stretch upward and formed an elastic tilt angle. On one upward-tilting side of the metal pressing board is bent downward and form an opening, while the other side of the metal pressing board has separate holes. The top end of the metal hook-up board forms a flat surface where force is applied when hooking up with the ZIF socket. On the two sides of the metal hook-up board are protrusions separately to be inserted into the holes of the metal pressing board. On the bottom of the metal hook-up board there is an opening to be hooked by the hook on the side of the ZIF socket. Thus, using the upward elasticity of the metal pressing board, the dissipator board and the CPU can be fixed together tightly and achieve ventilation. Also the present invention provides a non-finned area on the dissipator board so that the metal pressing board can be put across the dissipator board and be buckled up with the hook on the ZIF socket; therefore, the present invention can be used with any kind of dissipator.

2 Claims, 5 Drawing Sheets

CPU HEAT DISSIPATOR HOOK-UP APPARATUS

FIELD OF THE INVENTION

The present invention relates generally to a CPU heat dissipator hook-up apparatus and in particular to a dissipator hook up apparatus comprising a metal pressing board and metal hook up board to which the dissipator and the CPU can be easily hooked up on a ZIF (zero insert force) socket.

BACKGROUND OF THE INVENTION

As shown in FIG. 1, a prior-art CPU dissipator hook up apparatus used on a ZIF socket includes a rim of the frame 1 projecting inwardly to form a pressing board 11. The left and the right side of the frame 1 extend downward to a hook-up plate 12, and the front and the rear side extend downward to a blocking board 13. The end of the hook-up plate 12 forms a hook 121. The frame 1 must be assembled with the hook-up plate facing upward. When trying to buckle these boards together, the frame 1 is place between the ZIF socket 2 and the CPU 3 and the surrounding shoulder of the CPU 3 is placed onto the pressing board 11. When the CPU 3 is placed on the ZIF socket 2, the frame 1 is then fixed in between. After these are secured, the dissipator board 4 is put on the surface of the CPU 3 and is secured on both sides by the hook 121 of the frame 1.

Such an assembly procedure is so complicated that whoever is not familiar with it will never figure out how these boards are assembled. Besides that, the plastic frame 1 does not help heat conduction, and while the unit is working, the heat generated by the CPU will not only deform the plastic frame 1 and cause the dissipator board 4 to fail, but also will affect the clamping devices between the boards.

Therefore, for an effective CPU ventilator hook-up apparatus, the main objective of the present invention is to provide a dissipator hook-up apparatus having a metal pressing board and a metal hook-up board. The two sides of the metal pressing board stretch upward and form an elastic tilt angle. On one tilted side the metal pressing board is bent downward and forms an opening while the other side of the metal pressing board has two separate holes. The top end of the metal hook-up board forms a flat surface where force is applied when hooking up downwardly with the ZIF socket. Also, each of the two sides of the metal hook-up board has a protrusion respectively to be inserted into the hole of the metal pressing board while being assembled. On the bottom of the metal hook-up board there is an opening formed to be hooked by a hook on the side of the ZIF socket. Thus, using the upward elasticity of the metal pressing board, the dissipator board and the CPU can be fixed together tightly and achieve the purpose of ventilation.

Another objective of this invention is to provide a non-finned area on the CPU dissipator so as to that the metal pressing board can be put across the dissipator board and be buckled up with the hook on the ZIF socket, so that, no matter the height of the fin may be, the present invention can be adapted to it.

Still another objective of the invention is to provide a metal hook-up apparatus in which the effect of dissipation of heat generated by CPU will be greatly increased.

SUMMARY OF THE INVENTION

The present invention is to provide a dissipator hook-up apparatus having a metal pressing board and a metal hook-up board. The two sides of the metal pressing board stretch upward and form an elastic tilt angle. From there, on one tilted side the metal pressing board is bent downward and forms an opening, while the other side of the metal pressing board is formed with two separate holes. The top end of the metal hook-up board forms a flat surface where the force is applied when hooking up downwardly with the ZIF socket. Also on the two sides of the metal hook-up board are formed protrusions to be separately inserted into the hole of the metal pressing board while being assembled. On the bottom of the metal hook-up board there is an opening adapted to be hooked by the hook formed on the side of the ZIF socket. Thus, using the upward elasticity of the metal pressing board, the dissipator board and the CPU can be fixed together tightly and achieve the purpose of ventilation. Also, the present invention provides a non-finned area on the dissipator board so as to that the metal pressing board can be put across the dissipator board and be buckled up with the hook on the ZIF socket; therefore, no matter the height of the fin may be, the present invention can be adapted to all heights. The present invention provides a metal hook-up apparatus with which the effect of dissipation of heat generated by CPU will be greatly increased.

BRIEF DESCRIPTION OF THE DRAWING

The present invention will be better understood from the following description of preferred embodiments of the present invention, with reference to the attached drawing, wherein.

DETAILED DESCRIPTION OF THE PREFERRED EMBODIMENTS

Figure 1:
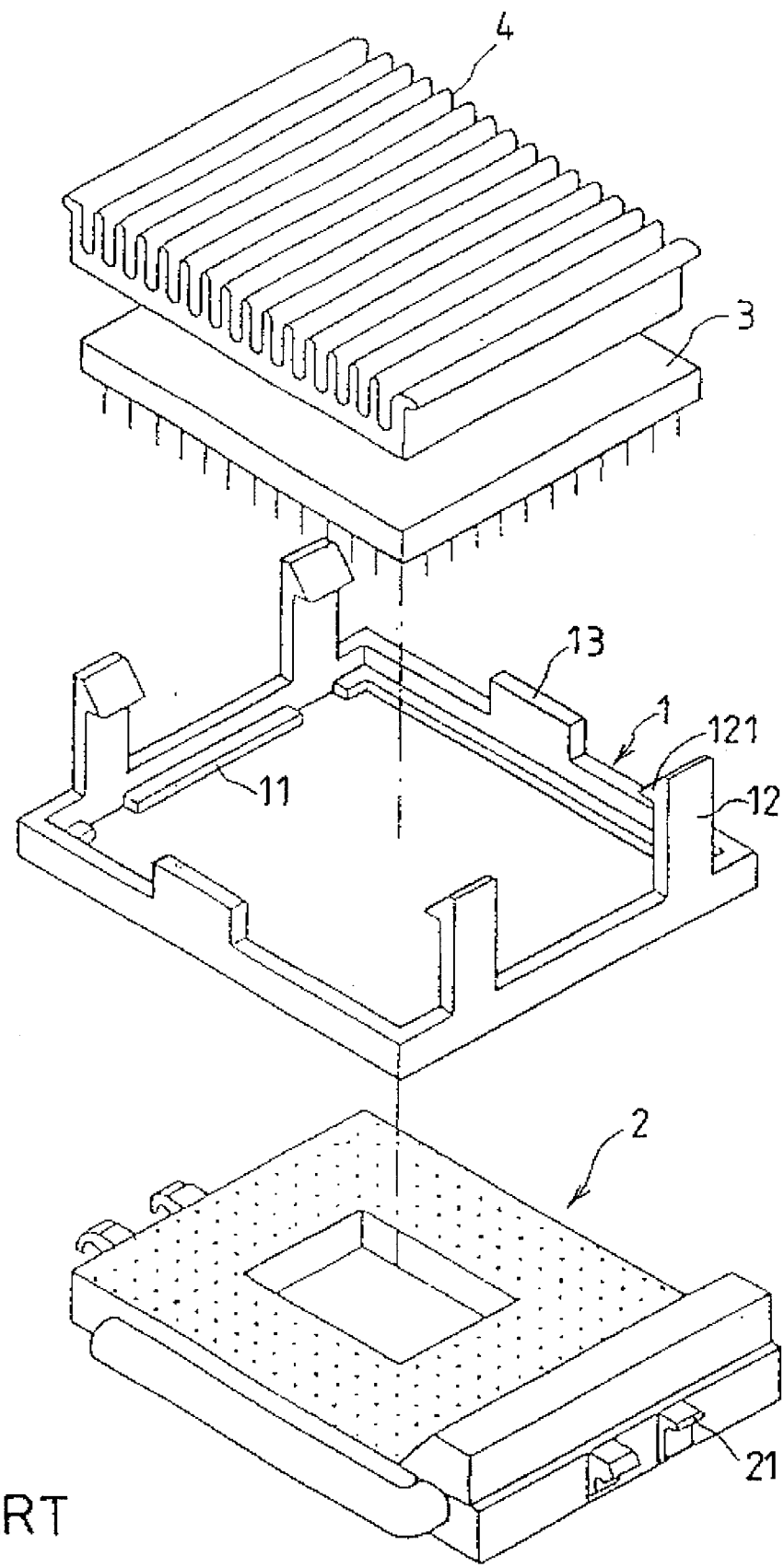
FIG. 1 is an exploded view of the prior-art hook-up apparatus applied to the ZIF socket.
Figure 2:
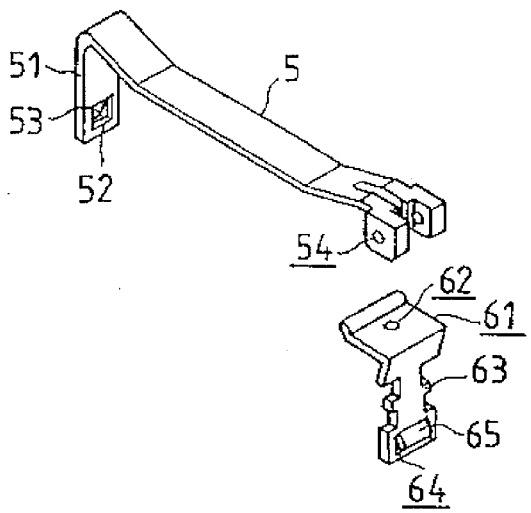
FIG. 2 is also an exploded perspective view of the present invention showing the detail features of the hook-up apparatus.
Figure 2:
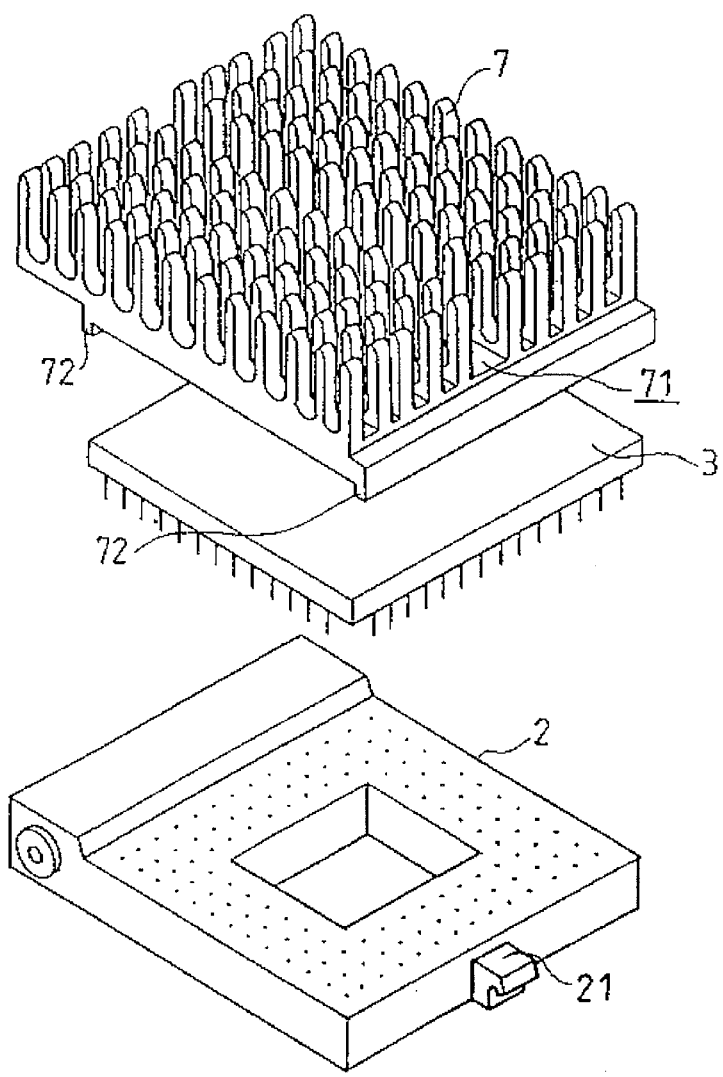

With reference to the drawings and in particular FIGS. 2–5, a hook-up apparatus having a metal pressing board 5 and a metal hook-up board 6 constructed in accordance with the present invention, are shown. The hook-up apparatus is constructed having a metal pressing board 5 and a metal hook-up board 6, where the two ends of the metal pressing board 5 form an upward elastic tilt angle, and on one end of the metal pressing board 5, an opening 52 for hooking up the hook 21 formed on the ZIF socket 2 is formed on the plate 51 which is bent at a downward angle from the surface of the metal pressing board 5. The upper part of the opening 52 stretches downward and forms a metal plate 53 for protecting the hook 21 on the ZIF socket 2 from breaking. The other end of the metal pressing board 5 has a hole 54.

A flat surface 61 on the top end of the metal hook-up board 6 is for applying force when buckling downward with the ZIF socket 2. On the surface 61, a round hole 62 is formed to be the point of applying force when using an auxiliary pin-like tool. The two sides of the metal hook-up board 6 each include a pin 63 for the purpose of buckling with the holes 54 of the metal pressing board 5. At the bottom of the metal hook-up board 6, an opening 64 is formed for hooking up the hook 21 on the ZIF socket 2. For protecting the hook 21 on the ZIF socket 2 from breaking, the upper part of the open 64 stretches downward a metal plate 65.

A non-finned area 71 on the dissipator board 7 is formed for the metal hook-up board 5 to cross both sides of the dissipator board 7, and to buckle with the hook 21 on the ZIF socket 2. Therefore, no matter what the height the fin is, the present invention can be used.

Figure 3:
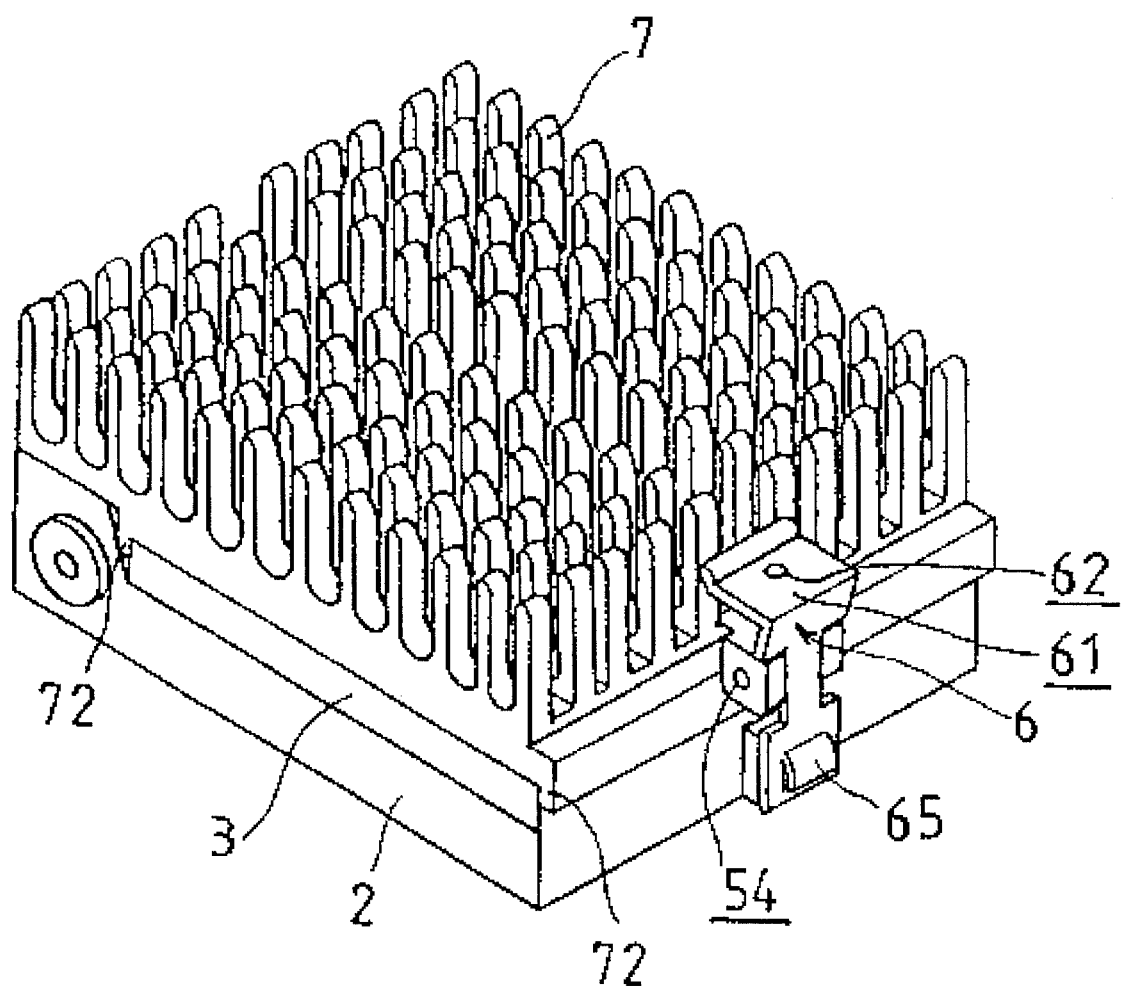
FIG. 3 is a perspective view of the present invention showing all the boards assembled together with the hook-up apparatus.
Figure 4:
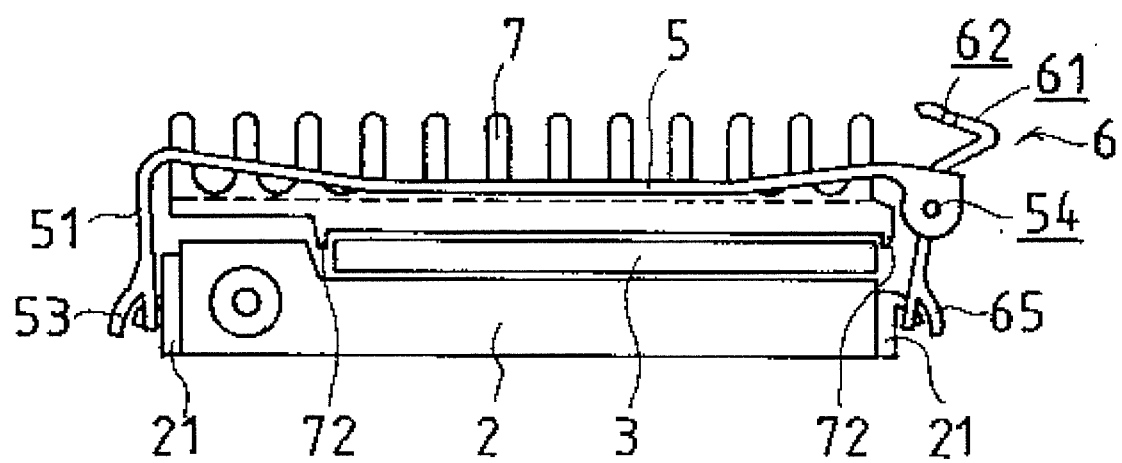
FIG. 4 is a side view of the present invention in accordance with FIG. 2.

Referring to FIG. 3 and FIG. 4, we see that, when the boards are assembled together, the CPU 3 is first inserted into the ZIF socket 2, and then the dissipator board 7 is put on the top of the CPU 3. The projections 72 on the bottom of the dissipator board 7 are so spaced as to restrain the sides of the CPU from sliding. Inserting the pins 63 formed on the metal hook-up board 6 into the hole 54 formed on the metal pressing board 5 makes the two boards a complete buckling device. After the opening 52 of the metal pressing board 5 is inserted into the hook 21 of the ZIF socket 2 and the metal pressing board 5 is lying on the non-finned area 71, one may press the surface 61 of the metal hook-up board 6 with a finger, or on the hole 62 with an auxiliary pin-like tool, to make the opening 64 formed on the bottom of the metal hook-up board 6 insert into the hook 21 of the ZIF socket 2. Because of the force on both ends of the metal pressing board 5, the end of the metal pressing board 5 is then deformed, but when the force applied on the metal pressing board 5 disappears the ends of the metal pressing board 5 will then spring up and restore the board 5 back to the original shape. Then the assembly of CPU 3 with the dissipator board 7 is completed.

When disassembling, one may apply a little pressure on the surface 61 of the metal hook-up board 6 and turn outward to make the opening 64 of the metal hook-up board 6 separate from the hook 21 of the ZIF socket 2, and then CPU 3 will come apart from the dissipator board 7.

Figure 5:
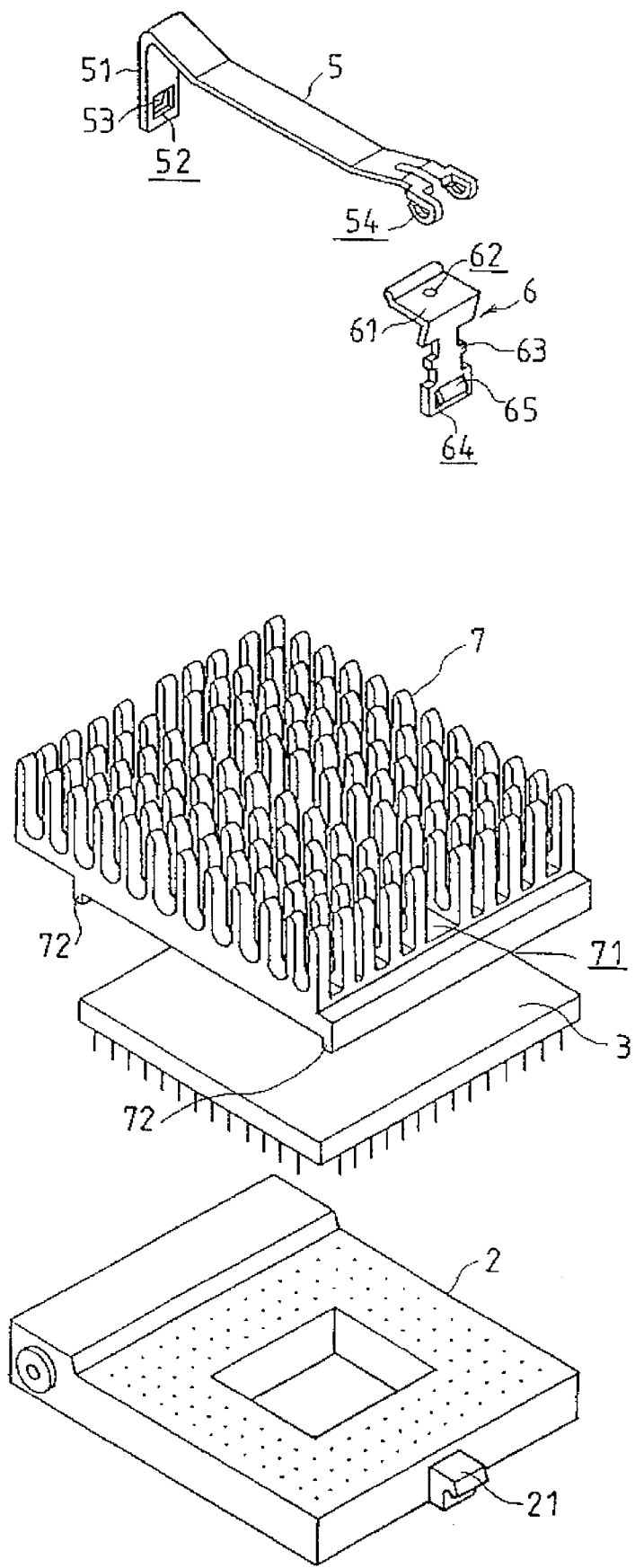
FIG. 5 is another exploded view of the present invention showing a different design of the hole formed on the metal pressing board.

Referring to FIG. 5, the hole 54 formed on the end of the metal pressing board 5 is shown with another shape. The ends of the metal pressing board 5 are bent inward and form a round hole to serve the purpose of accepting the pins 63 of the metal hook-up board 6.

It is apparent that although the invention has been described in connection with the embodiment as a CPU dissipator hook-up apparatus, it is contemplated that those skilled in the art may make changes to the preferred embodiment without departing from the scope of the invention as defined in the appended claims and can apply the same technique to the hook-up apparatus, especially the apparatus having two holes for engaging the metal pressing board to serve other uses.

I claim:

1. A CPU dissipator hook-up apparatus comprising:

(a) a metal pressing board including two ends, the two ends including a first end and a second end, the ends stretching upward from the pressing board at an elastic tilt angle thereto, the first end including a first tilted portion and the second end including a second tilted portion, the first end including a downwardly-bent portion having a first opening, the second end including two pivot first holes; and (b) a metal hook-up board having two sides and including pins on either of the sides for respectively engaging the two pivot first holes of the pressing board, a flat surface having a second hole thereon, and a second opening in a bottom of the hook-up board having a downwardly-extending plate.

2. The CPU dissipator hook-up apparatus according to claim 1, further comprising a dissipator board including a non-finned area for accepting the pressing board thereon.

\* \* \* \* \*